(12) United States Patent
Lu et al.

(10) Patent No.: US 10,128,181 B2
(45) Date of Patent: Nov. 13, 2018

(54) PACKAGE STRUCTURE AND FABRICATING METHOD THEREOF

(71) Applicant: Delta Electronics (Shanghai) Co., Ltd., Shanghai (CN)

(72) Inventors: Kai Lu, Shanghai (CN); Zhenqing Zhao, Shanghai (CN); Tao Wang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/151,906

(22) Filed: May 11, 2016

(65) Prior Publication Data

US 2017/0133314 A1    May 11, 2017

(30) Foreign Application Priority Data

Nov. 5, 2015   (CN) .......................... 2015 1 0746327

(51) Int. Cl.
*H01L 21/48* (2006.01)
*H01L 23/495* (2006.01)
(Continued)

(52) U.S. Cl.
CPC .... *H01L 23/49861* (2013.01); *H01L 21/4846* (2013.01); *H01L 21/56* (2013.01);
(Continued)

(58) Field of Classification Search
None
See application file for complete search history.

(56) References Cited

U.S. PATENT DOCUMENTS 5,398,160 A * 3/1995 Umeda ................. H01L 23/057
257/711
5,747,875 A * 5/1998 Oshima .................. H01L 25/16
257/687

(Continued)

FOREIGN PATENT DOCUMENTS

CN          1086373 A     5/1994
CN          2640202 Y     9/2004
(Continued)

*Primary Examiner* — Michael Lebentritt
*Assistant Examiner* — Jordan Klein
(74) *Attorney, Agent, or Firm* — Kirton McConkie; Evan R. Witt

(57) ABSTRACT

A package structure includes a first carrier plate, a second carrier plate, a pin group and an encapsulant member. A power component is disposed on a first top surface of the first carrier plate. The second carrier plate is disposed on the first top surface of the first carrier plate. A driving circuit is disposed on a second top surface of the second carrier plate for driving the power component. An opening runs through the second carrier plate, and the power component is accommodated within the opening. The pin group is assembled on the first carrier plate and/or the second carrier plate. The encapsulant member encapsulates the first carrier plate, the second carrier plate, a part of the first pin group and a part of the second pin group, so that the first pin group and the second pin group are partially exposed outside the encapsulant member.

8 Claims, 8 Drawing Sheets

(51) Int. Cl.
*H01L 23/498* (2006.01)
*H01L 21/56* (2006.01)
*H01L 23/31* (2006.01)
*H01L 23/00* (2006.01)
*H01L 25/16* (2006.01)
*H01L 25/18* (2006.01)
*H01L 23/433* (2006.01)

(52) U.S. Cl.
CPC ...... *H01L 23/3121* (2013.01); *H01L 23/4334* (2013.01); *H01L 23/49517* (2013.01); *H01L 23/49531* (2013.01); *H01L 23/49541* (2013.01); *H01L 23/49562* (2013.01); *H01L 23/49568* (2013.01); *H01L 23/49575* (2013.01); *H01L 23/49582* (2013.01); *H01L 23/49811* (2013.01); *H01L 24/32* (2013.01); *H01L 24/49* (2013.01); *H01L 24/73* (2013.01); *H01L 24/83* (2013.01); *H01L 25/16* (2013.01); *H01L 25/18* (2013.01); *H01L 23/3107* (2013.01); *H01L 24/48* (2013.01); *H01L 2224/32245* (2013.01); *H01L 2224/48091* (2013.01); *H01L 2224/48101* (2013.01); *H01L 2224/48106* (2013.01); *H01L 2224/48137* (2013.01); *H01L 2224/48139* (2013.01); *H01L 2224/48247* (2013.01); *H01L 2224/73265* (2013.01); *H01L 2924/00014* (2013.01); *H01L 2924/1033* (2013.01); *H01L 2924/13055* (2013.01); *H01L 2924/13091* (2013.01); *H01L 2924/1426* (2013.01); *H01L 2924/17747* (2013.01)

(56) References Cited

U.S. PATENT DOCUMENTS

| | | | | |
|---|---|---|---|---|
| 5,920,119 | A * | 7/1999 | Tamba | H01L 25/18 257/678 |
| 6,144,571 | A * | 11/2000 | Sasaki | H01L 25/162 257/687 |
| 6,291,880 | B1 * | 9/2001 | Ogawa | H01L 23/4334 257/723 |
| 6,876,553 | B2 * | 4/2005 | Zhao | H01L 23/16 257/E23.092 |
| 8,436,459 | B2 * | 5/2013 | Oka | H01L 23/3735 257/691 |
| 9,142,473 | B2 * | 9/2015 | Hung | H01L 23/3135 |
| 9,379,096 | B2 * | 6/2016 | Denta | H01L 23/49833 |
| 9,468,087 | B1 * | 10/2016 | Joshi | H05K 1/0209 |
| 2003/0085456 | A1 * | 5/2003 | Lee | H01L 23/049 257/686 |
| 2007/0138651 | A1 * | 6/2007 | Hauenstein | H01L 23/13 257/782 |
| 2009/0218665 | A1 * | 9/2009 | Yang | H01L 23/13 257/676 |
| 2009/0243078 | A1 * | 10/2009 | Lim | H01L 23/4334 257/690 |
| 2015/0092376 | A1 * | 4/2015 | Arens | H01L 21/56 361/767 |

FOREIGN PATENT DOCUMENTS

CN 2696284 Y 4/2005
CN 102159054 A 8/2011

* cited by examiner

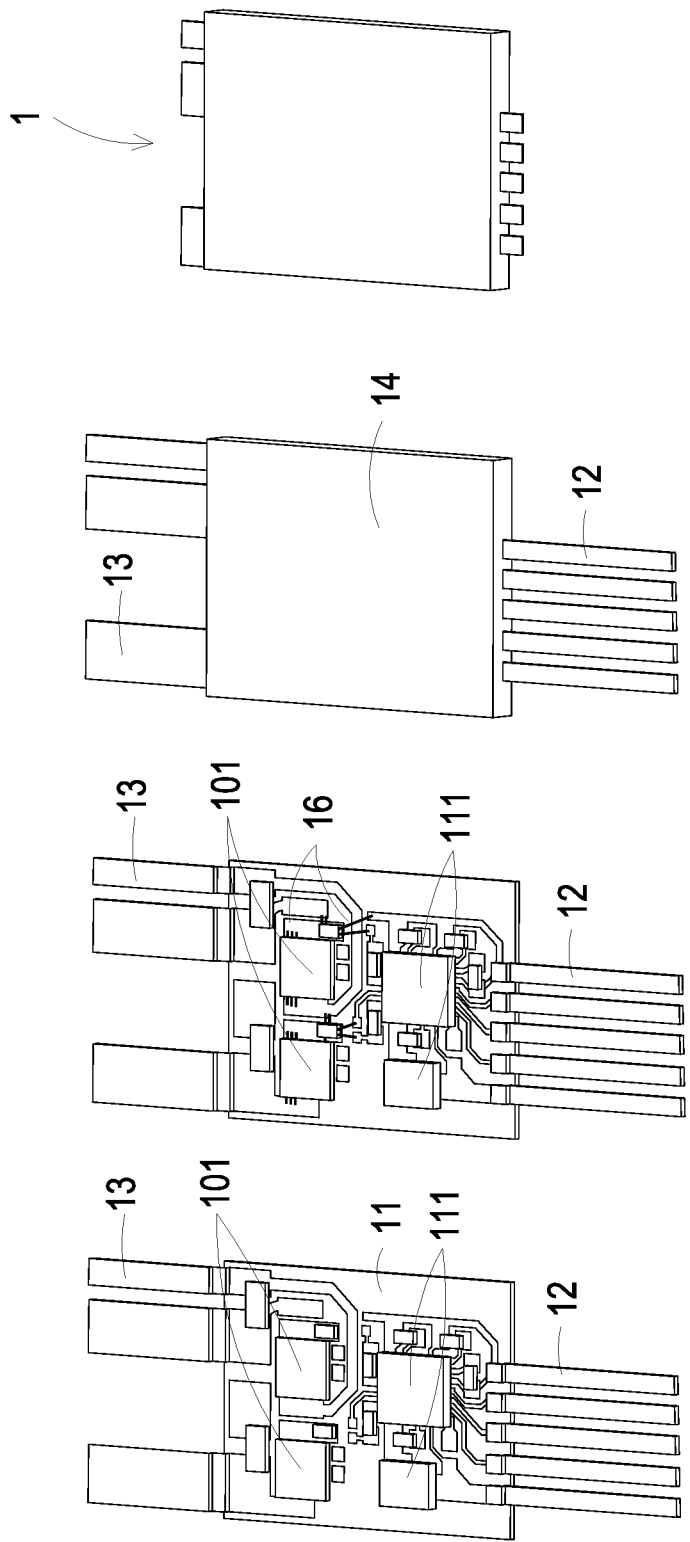

PACKAGE STRUCTURE AND FABRICATING METHOD THEREOF

FIELD OF THE INVENTION

The present invention relates to a package structure and a fabricating method thereof, and more particularly to a package structure of a power converter and a fabricating method thereof, so as to increase the power density, decrease the size and enhancing the heat-dissipating efficiency.

BACKGROUND OF THE INVENTION

Nowadays, electrical and electronic industries continuously develop power converters that require high efficiency, high power density and high reliability. High efficiency indicates low power consumption, low pollution generation, environment friendliness and low use cost. High power density indicates small volume, light weightiness, low transportation cost, small layout space and low installation cost. High reliability indicates long use life and low maintenance cost. As know, a semiconductor component is one of the important factors influencing the efficiency of the power converter. For complying with the requirements of the power converter, the general trends in designing semiconductor components are toward small size, compact package, light weightiness and portability. For example, more and more semiconductor components such as driving components, monitoring components and passive components have to be placed within a package structure. As the size of the package structure of the power component is gradually reduced, the demand on high heat-dissipating efficiency is gradually increased.

Generally, a power converter comprises at least one power component and a driving circuit for driving the at least one power component. The driving circuit comprises a driving component and passive components (e.g., capacitors or resistors). In a conventional power converter, a direct bonded copper (DBC) substrate is usually used as an installation carrier of the power component, and the DBC substrate and the power component are collaboratively encapsulated as a package structure. In addition, the driving circuit is located outside the package structure.

Moreover, with the increasing development of electronic industries, the internal circuitries of the electronic devices are gradually modularized to increase the power density. For example, by packaging the driving circuit and the power component as a package structure, the driving circuit and the power component of the power converter are integrated into a single circuit module. Since the signal or voltage that is transmitted or received by the driving circuit is lower, the demand on the current-flowing capability (i.e., the current-withstanding capability) of the driving circuit is not high. In other words, the trace of the driving circuit can be made denser. However, due to the characteristics of the direct bonded copper substrate, the traces of the direct bonded copper substrate are neither narrow nor dense. For example, the minimum width of the trace for the 0.25 mm-thickness direct bonded copper substrate is 0.5 mm. Consequently, the direct bonded copper substrate in the conventional package structure of the power converter is only used to install the power component that requires current-flowing capability and the heat-dissipating efficiency. In other words, the direct bonded copper substrate is not suitable for installing the driving circuit. Consequently, the power density of the conventional package structure of the power converter is still not satisfied.

As mentioned above, an additional component or means is required to integrate the driving circuit into the package structure that contains the direct bonded copper substrate. Under this circumstance, the size and the wiring flexibility of the package structure of the power converter are limited.

Therefore, there is a need of providing a package structure with enhanced heat-dissipating efficiency and a fabricating method thereof so as to overcome the above drawbacks.

SUMMARY OF THE INVENTION

An object of the present invention provides a package structure and a fabricating method thereof. A power component is disposed on a first carrier plate with higher current-flowing capability and higher heat-dissipating efficiency. A driving circuit is disposed on a second carrier plate with higher trace density. The second carrier plate includes an opening corresponding to the power component. Moreover, when the second carrier plate is attached on the first carrier plate, the power component is accommodated within the corresponding opening of the second carrier plate and disposed on the first carrier plate. Consequently, the package structure of the present invention has reduced volume and enhanced heat-dissipating efficiency. Under this circumstance, the electric connection distance between the driving circuit and the power component is shortened, and the electrical impedance and the parasitic parameter are reduced. Consequently, the package structure is suitably operated at higher frequency.

In accordance with an aspect of the present invention, there is provided a package structure. The package structure includes a first carrier plate, a second carrier plate, a pin group and an encapsulant member. At least a power component is disposed on a first top surface of the first carrier plate. The second carrier plate is attached on the first top surface of the first carrier plate, and includes a driving circuit and at least an opening. The driving circuit is disposed on a second top surface of the second carrier plate for driving the power component. The opening runs through the second carrier plate and corresponds to the power component. When the second carrier plate is disposed on the first top surface, the power component is accommodated within the opening. The pin group is assembled on the first carrier plate and/or the second carrier plate, wherein the pin group comprises a first pin group and a second pin group. The first pin group is electrically connected with the driving circuit, and the second pin group is electrically connected with the power component. The encapsulant member encapsulates the first carrier plate, the second carrier plate, a part of the first pin group and a part of the second pin group, so that the first pin group and the second pin group are partially exposed outside the encapsulant member.

In accordance with another aspect of the present invention, there is provided a fabricating method of a package structure. The fabricating method includes the following steps. Firstly, a power component is placed on a first carrier plate. Then, a driving circuit is placed on a second carrier plate, and a first pin group and a second pin group are assembled on the first carrier plate and/or the second carrier plate. The second carrier plate has an opening. Then, the second carrier plate is attached on the first carrier plate, wherein the power component is accommodated within the opening. Then, the first carrier, the second carrier, the power component, the driving circuit, the first pin group and the second pin group are electrically connected with each other. Then, the first carrier, the second carrier, the power component, the driving circuit, the first pin group and the second pin group are packaged with an encapsulant member, wherein the first pin group and the second pin group are partially exposed outside the encapsulant member. Then, a trim and form process is performed to treat the first pin group and the second pin group which are exposed outside the encapsulant member.

From the above descriptions, the package structure of the present invention has reduced volume and enhanced heat-dissipating efficiency. Under this circumstance, the electric connection distance between the driving circuit and the power component is shortened, and the electrical impedance and the parasitic parameter are reduced.

The above contents of the present invention will become more readily apparent to those ordinarily skilled in the art after reviewing the following detailed description and accompanying drawings, in which:

BRIEF DESCRIPTION OF THE DRAWINGS

FIGS. 3A to 3F schematically illustrate a process of fabricating the package structure of FIG. 1;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
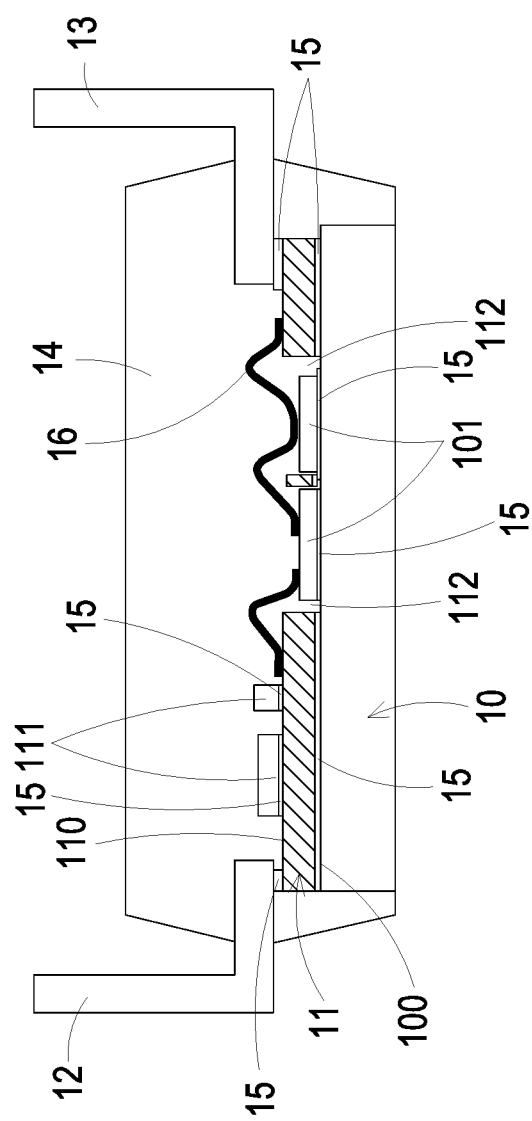
FIG. 1 schematically illustrates a package structure according to a first embodiment of the present invention.
Figure 2:
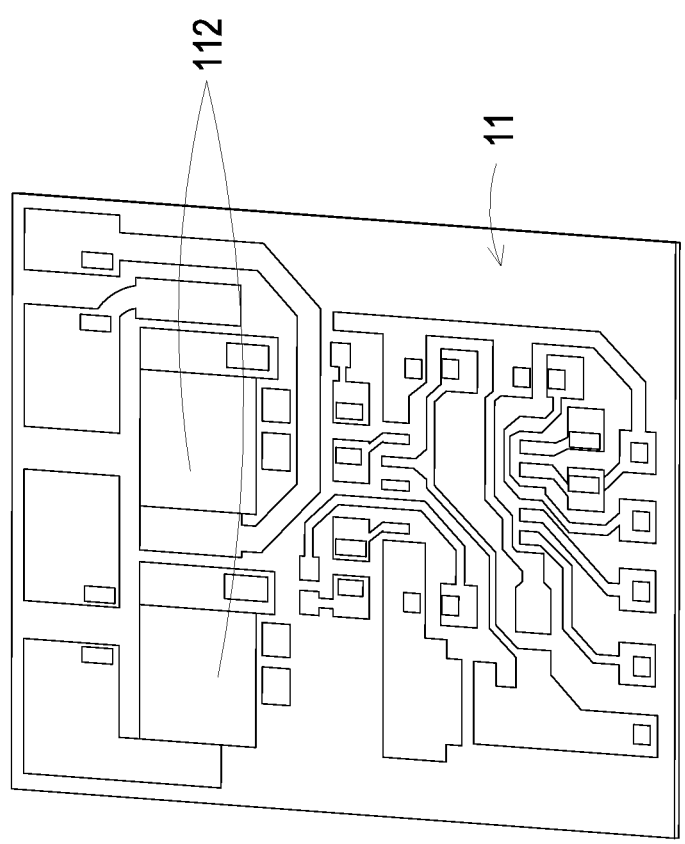
FIG. 2 schematically illustrates a second carrier plate of the package structure of FIG. 1.

FIG. 1 schematically illustrates a package structure according to a first embodiment of the present invention. FIG. 2 schematically illustrates a second carrier plate of the package structure of FIG. 1. In one embodiment, the package structure 1 is applied to a power converter. As shown in FIGS. 1 and 2, the package structure 1 comprises a first carrier plate 10, a second carrier plate 11, a pin group and an encapsulant member 14. The pin group is connected with the first carrier plate 10 and/or the second carrier plate 11. The pin group comprises a first pin group 12 and a second pin group 13. The first carrier plate 10 has a first top surface 100. At least one power component 101 is disposed on the first top surface 100 of the first carrier plate 10. As shown in FIG. 1, two power components 101 are disposed on the first top surface 100 of the first carrier plate 10. The second carrier plate 11 is disposed on the first top surface 100 of the first carrier plate 10. The second carrier plate 11 has a second top surface 110. In addition, two openings 112 run through the second carrier plate 11. A driving circuit 111 is disposed on the second top surface 110. The driving circuit 111 is used for driving the power component 101. Generally, the driving circuit 111 comprises at least one driving component and at least one passive component. An example of the passive component includes but is not limited to a capacitor or a resistor. As shown in FIGS. 1 and 2, the two openings 112 of the second carrier plate 11 are aligned with the corresponding two power components 101, respectively. After the second carrier plate 11 is disposed on the first top surface 100 of the first carrier plate 10, the two power components 101 are accommodated within the two openings 112, respectively. In this embodiment, both of the first pin group 12 and the second pin group 13 are assembled on the second carrier plate 11. The first carrier plate 10, the second carrier plate 11, a part of the first pin group 12 and a part of the second pin group 13 are encapsulated by the encapsulant member 14. In addition, another part of the first pin group 12 and another part of the second pin group 13 are exposed outside the encapsulant member 14.

In this embodiment, the part of the first pin group 12 and the part of the second pin group 13 that are exposed outside the encapsulant member 14 can be connected to a system circuit board (not shown). Moreover, a bonding material 15 is arranged between the first carrier plate 10 and the second carrier plate 11. The first carrier plate 10 and the second carrier plate 11 are combined together via the bonding material 15. In this embodiment, the first pin group 12 and the second pin group 13 are assembled on the second carrier plate 11 via the bonding material 15. The power components 101 and the driving circuit 111 are respectively assembled on the first carrier plate 10 and the second carrier plate 11 via the bonding material 15. An example of the bonding material 15 includes but is not limited to a soldering material or an epoxy resin.

Moreover, the power components 101, the driving circuit 111, the first pin group 12 and the second pin group 13 are electrically connected with each other through bonding wires 16, traces (not shown) of the first carrier plate 10 and traces (not shown) of the second carrier plate 11. As shown in FIG. 1, the first pin group 12 and the driving circuit 111 are electrically connected with each other through the corresponding bonding material 15 and the traces (not shown) of the second carrier plate 11, the driving circuit 111 and the power component 101 are electrically connected with each other through the traces (not shown) of the second carrier plate 11 and the corresponding bonding wire 16, the two power components 101 are electrically connected with each other through the corresponding bonding wire 16, and the second pin group 13 and the power component 101 are electrically connected with each other through the corresponding bonding material 15, the traces (not shown) of the second carrier plate 11 and the bonding wires 16. It is noted that the connections between the power components 101, the driving circuit 111, the first pin group 12 and the second pin group 13 may be varied according to the circuitry layout of the package structure 1. Moreover, the encapsulant member 14 is made of resin. The first pin group 12 and the second pin group 13 may be integrally formed with the same lead frame or different lead frame. Exampley but not exclusively, the first pin group 12 is electrically connected with the driving circuit 111, and the second pin group 13 is electrically connected with the power component 101. In another embodiment, the first pin group 12 is electrically connected with the power component 101, and the second pin group 13 is electrically connected with the driving circuit 111.

In an embodiment, the number and position of the openings 112 of the second carrier plate 11 are determined according to the number and position of the power components 101 on the first carrier plate 10. More especially, the number and position of the openings 112 of the second carrier plate 11 and the number and position of the power components 101 of the first carrier plate 10 can be determined according to the applications and the heat dissipating demands. In the embodiment as shown in FIG. 2, the openings 112 are rectangular. In some other embodiments, the openings are circular, hexagonal or rhombic. The size and shape of the openings 112 are determined according to the size of the power components 101 and the installations of the first carrier plate 10 and the second carrier plate 11. Preferably, the size of the opening 112 is larger than the size of the corresponding power component 101. The bonding material 15 is conductive or non-conductive. Moreover, the thickness of the bonding material 15 is larger than 20 µm. The areas of the first carrier plate 10 and the second carrier plate 11 may be varied according to the practical requirements. In some embodiments, the area of the first carrier plate 10 is smaller than the area of the second carrier plate 11. When the heat-dissipating demand is taken into consideration, the area of the first carrier plate 10 is larger than the area of the second carrier plate 11. Moreover, the material of the first carrier plate 10 may be determined according to the type of the power component 101. For example, in case that the power component 101 is a vertical power component (e.g., a vertical MOS or a vertical IGBT), the first carrier plate 10 further comprises an insulation layer. In case that the first carrier plate 10 is a direct bonded copper (DBC) substrate, the insulation layer is a ceramic layer of the direct bonded copper (DBC) substrate.

The power component 101 is disposed on the first carrier plate 10. Since the power component 101 requires higher current-flowing capability and higher heat-dissipating efficiency, the current-flowing capability and the heat-dissipating efficiency of the first carrier plate 10 are higher than the current-flowing capability and the heat-dissipating efficiency of the second carrier plate 11. Moreover, the driving circuit 111 is disposed on the second carrier plate 11. Since the driving circuit 111 requires higher trace density, the trace density of the second carrier plate 11 is higher than the trace density of the first carrier plate 10. For example, the first carrier plate 10 is a direct bonded copper (DBC) substrate, and the second carrier plate 11 is a printed circuit board (PCB) or an insulated metal substrate (IMS). Since the trace density of the second carrier plate 11 is higher, the widths of the traces of the second carrier plate 11 are narrower. Moreover, since the heat-dissipating efficiency of the first carrier plate 10 is higher, the heat-dissipating efficiency of the power component 101 is enhanced. Moreover, since the second carrier plate 11 is disposed on the first carrier plate 10 and the power component 101 is accommodated within the opening 112, the size of the overall package structure 1 is reduced. For example, the size of the overall package structure 1 along the horizontal direction is reduced. Moreover, since the opening 112 is aligned with the power component 101, the driving circuit 111 can be located near the power component 101. Under this circumstance, the electric connection distance between the driving circuit 111 and the power component 101 is shortened, and the electrical impedance and the parasitic parameter are reduced. Consequently, the package structure 1 is suitably operated at higher frequency (e.g., >500 kHz) while inhibiting the voltage peak.

FIGS. 3A to 3F schematically illustrate a process of fabricating the package structure of FIG. 1. The fabricating process comprises the following steps.

Figure 3A:
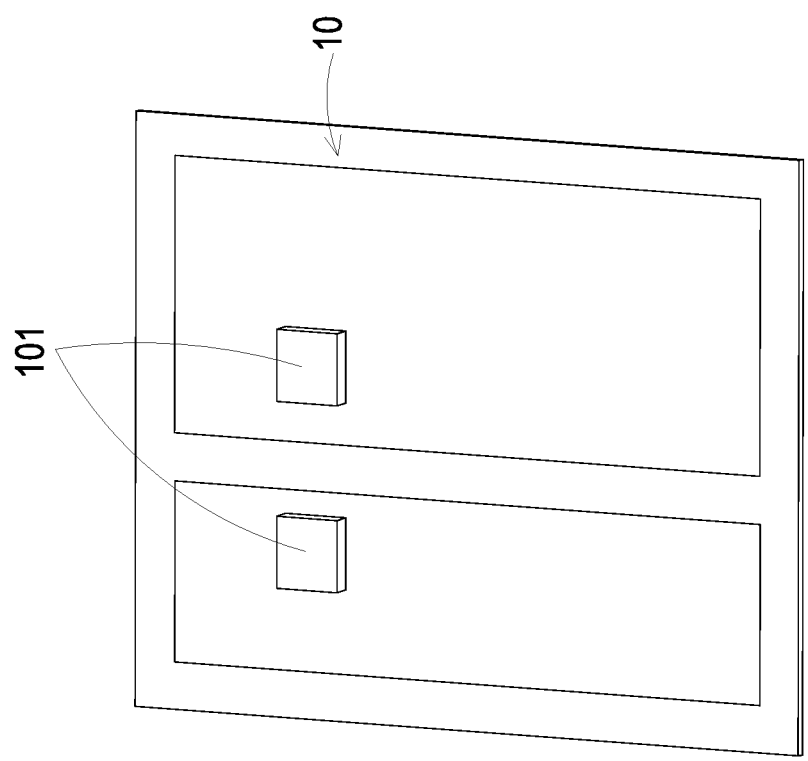

Firstly, as shown in FIG. 3A, power components 101 are assembled on a first carrier plate 10 (e.g., a direct bonded copper) through a bonding material 15.

Figure 3B:
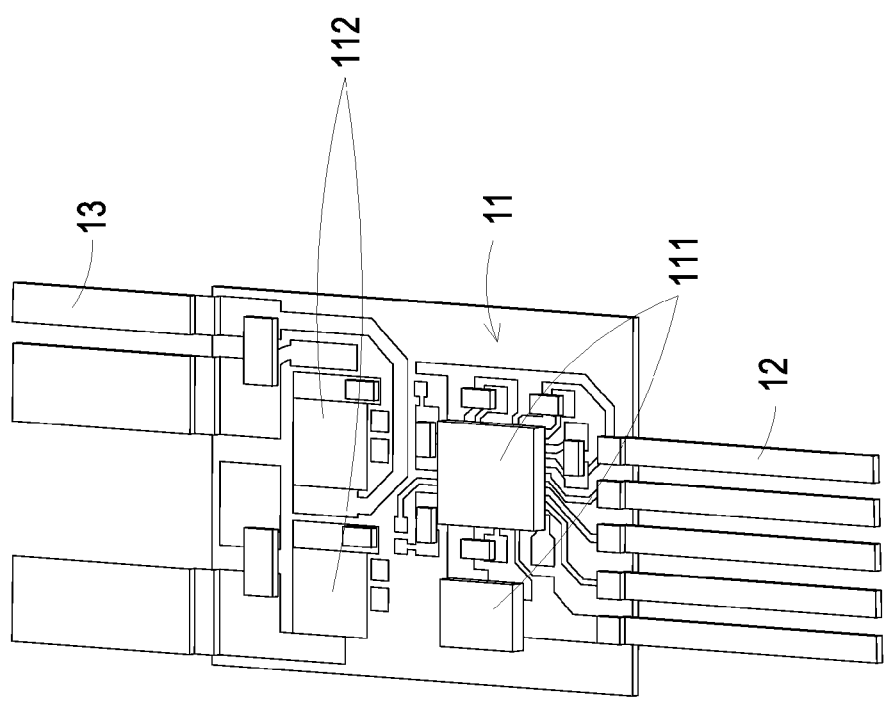

Then, as shown in FIG. 3B, a driving circuit 111 are assembled on a second carrier plate 11 (e.g., a printed circuit board). The second carrier plate 11 has openings 112, wherein the number and positions of the openings 112 are determined according to the number and positions of the power components 101. Moreover, the first pin group 12 and the second pin group 13 are assembled on the first carrier plate 10 and/or the second carrier plate 11.

Then, as shown in FIG. 3C, the first carrier plate 10 and the second carrier plate 11 are combined together through the bonding material 15. Under this circumstance, the power components 101 are accommodated within the corresponding openings 112.

Then, as shown in FIG. 3D, the power components 101, the driving circuit 111, the first pin group 12 and the second pin group 13 are electrically connected with each other through bonding wires 16, traces (not shown) of the first carrier plate 10 and traces (not shown) of the second carrier plate 11.

Then, as shown in FIG. 3E, the resulting structure of FIG. 3D is packaged with an encapsulant member 14.

Then, a trim and form process is performed to treat the first pin group 12 and the second pin group 13 which are exposed outside the encapsulant member 14. Consequently, the package structure as shown in FIG. 3F is produced.

It is noted that the step of FIG. 3B and the step of FIG. 3C may be exchanged. In case that the bonding material 15 is conductive, the components within the encapsulant member 14 are electrically connected with each other through the bonding wires 16, the traces (not shown) of the first carrier plate 10, the traces (not shown) of the second carrier plate 11 and the bonding material 15. Moreover, before the step of FIG. 3B, the openings 112 are formed in the second carrier plate 11.

Figure 4:
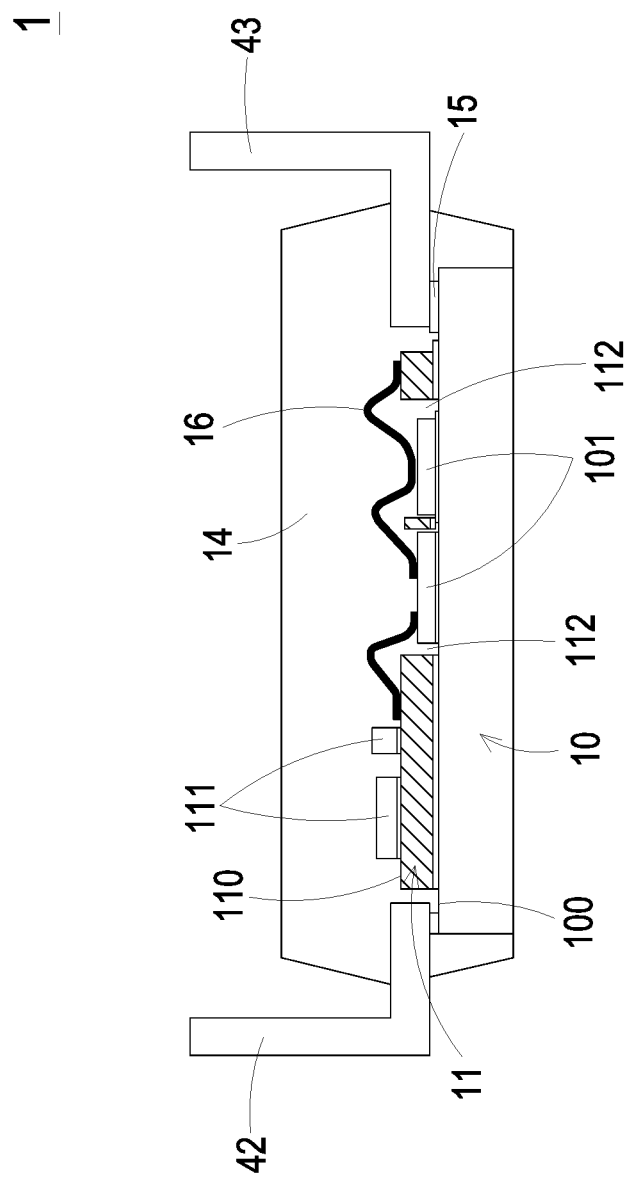
FIG. 4 schematically illustrates a package structure according to a second embodiment of the present invention.

FIG. 4 schematically illustrates a package structure according to a second embodiment of the present invention. Component parts and elements corresponding to those of the first embodiment are designated by identical numeral references, and detailed descriptions thereof are omitted. In the package structure 1 of FIG. 1, both of the first pin group 12 and the second pin group 13 are assembled on the second carrier plate 11. In this embodiment, both of the first pin group 42 and the second pin group 43 are assembled on the first carrier plate 10. Since the first carrier plate 10 has higher current-flowing capability, the first pin group 42 and the second pin group 43 can transfer more current. Moreover, since both of the first pin group 42 and the second pin group 43 are assembled on the first carrier plate 10, the heat generated by the power components 101 can be transferred to the first pin group 42 and the second pin group 43 through the first carrier plate 10 and exhausted to the surroundings of the package structure 1 through the first pin group 42 and the second pin group 43. Since the first carrier plate 10 has high heat-dissipating efficiency, the heat-dissipating efficiency of the package structure 1 is enhanced.

Figure 5:
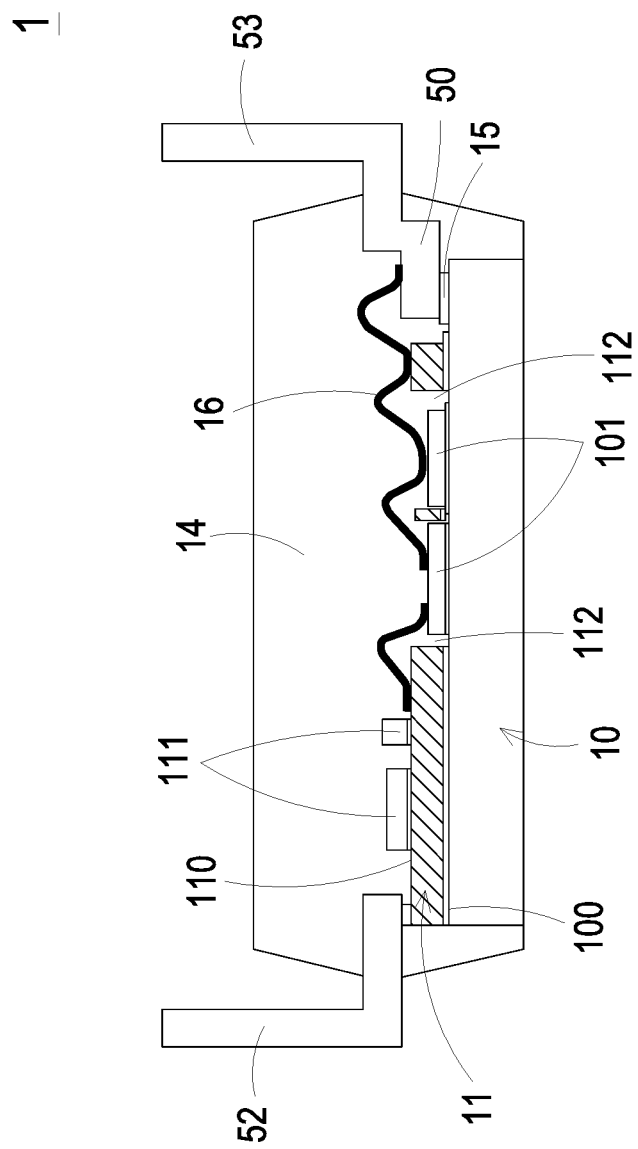
FIG. 5 schematically illustrates a package structure according to a third embodiment of the present invention.

FIG. 5 schematically illustrates a package structure according to a third embodiment of the present invention. Component parts and elements corresponding to those of the first embodiment are designated by identical numeral references, and detailed descriptions thereof are omitted. In the package structure 1 of FIG. 1, both of the first pin group 12 and the second pin group 13 are assembled on the second carrier plate 11. In this embodiment, the first pin group 52 is assembled on the second carrier plate 11, and the second pin group 53 is assembled on the first carrier plate 10. Moreover, the second pin group 53 is electrically connected with the corresponding power component 101. Since the first carrier plate 10 has higher current-flowing capability, the second pin group 53 can transfer more current. Moreover, since the first pin group 52 is electrically connected with the driving circuit 111 and the signal or voltage received by the driving circuit 111 is lower, the first pin group 52 transfers a small magnitude of current. Consequently, the first pin group 52 is assembled on the second carrier plate 11 and located near the driving circuit 111. Moreover, since the second carrier plate 11 is stacked over the first carrier plate 10, the first top surface 100 of the first carrier plate 10 is lower than the second top surface 110 of the second carrier plate 11. In this embodiment, the second pin group 53 further comprises a raised part 50. The raised part 50 is located at an end of the second pin group 53, and assembled on the first carrier plate 10. Since the thickness of the raised part 50 of the second pin group 53 is substantially equal to the thickness of the second carrier plate 11, the exposed part of the second pin group 53 and the exposed part of the first pin group 52 are at the same level.

Figure 6:
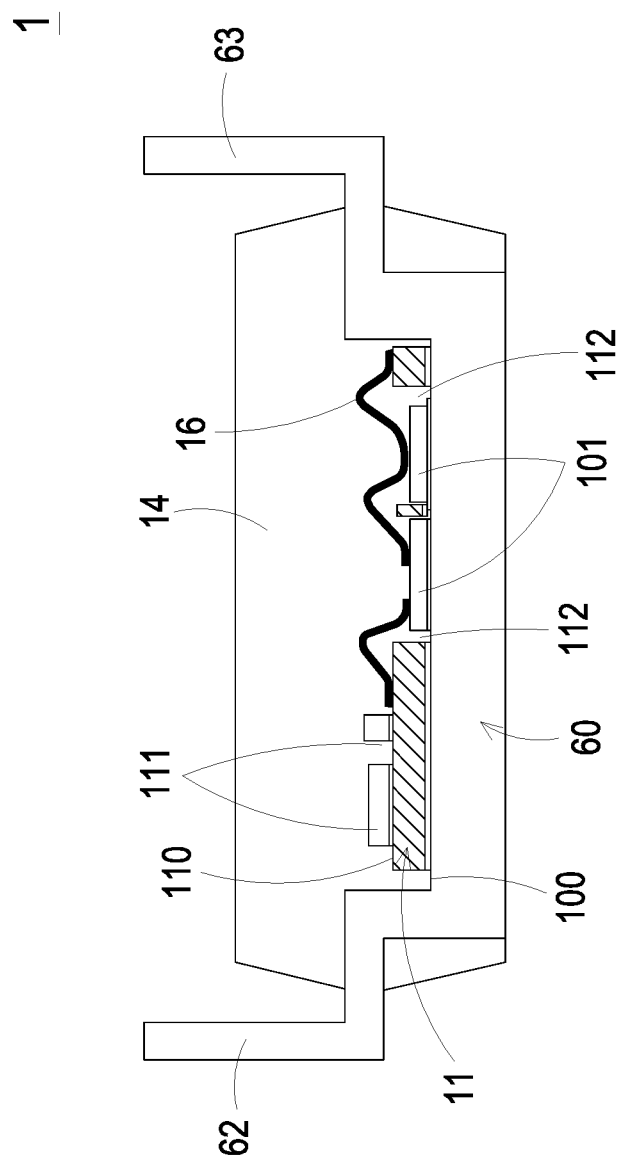
FIG. 6 schematically illustrates a package structure according to a fourth embodiment of the present invention.

In case that the power component 101 is a lateral power component such as Gallium nitride (GaN) chip, the first carrier plate 10 for installing the power component 101 is not equipped with the insulation layer. FIG. 6 schematically illustrates a package structure according to a fourth embodiment of the present invention. In this embodiment, the first carrier plate 10 is formed by a lead frame, and the first pin group 62 and the second pin group 63 are integrally formed with the lead frame, that the first carrier plate 10, the first pin group 62 and the second pin group 63 are integrally formed.

From the above descriptions, the present invention provides a package structure and a fabricating method thereof. A power component is disposed on a first carrier plate with higher current-flowing capability and higher heat-dissipating efficiency. A driving circuit is disposed on a second carrier plate with higher trace density. Moreover, the power component is accommodated within a corresponding opening of the second carrier plate. Consequently, the package structure of the present invention has reduced volume and enhanced heat-dissipating efficiency. Under this circumstance, the electric connection distance between the driving circuit and the power component is shortened, and the electrical impedance and the parasitic parameter are reduced. Consequently, the package structure is suitably operated at higher frequency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
a first carrier plate, wherein at least a power component is disposed on a first top surface of the first carrier plate, and a bottom surface of the power component is disposed on the first top surface of the first carrier plate;
a second carrier plate disposed on the first top surface of the first carrier plate, wherein a driving circuit is disposed on a second top surface of the second carrier plate for driving the power component, wherein at least an opening runs through the second carrier plate and corresponds to the power component, and the power component is accommodated within the opening when the second carrier plate is disposed on the first top surface of the first carrier plate;
a pin group assembled on the first carrier plate and/or the second carrier plate, wherein the pin group comprises a first pin group and a second pin group; and
an encapsulant member encapsulating the first carrier plate, the second carrier plate, a part of the first pin group and a part of the second pin group, so that the first pin group and the second pin group are partially exposed outside the encapsulant member;
wherein the trace density of the second carrier plate is higher than the trace density of the first carrier plate, and the second carrier plate is used to carry the driving circuit, but is not used to form the pins;
wherein the power component is directly disposed on the first carrier plate through a first bonding material when the power component is accommodated within the opening;
wherein the power component is a power chip, and a top surface of the power chip is not higher than the second top surface of the second carrier plate.

2. The package structure according to claim 1, wherein the current-flowing capability and the heat-dissipating efficiency of the first carrier plate are higher than the current-flowing capability and the heat-dissipating efficiency of the second carrier plate.

3. The package structure according to claim 1, wherein the first carrier plate is a direct bonded copper substrate, and the second carrier plate is a printed circuit board or an insulated metal substrate.

4. The package structure according to claim 1, wherein the first pin group is electrically connected with the driving circuit, and the second pin group is electrically connected with the power component.

5. The package structure according to claim 1, wherein both of the first pin group and the second pin group are assembled on the second carrier plate.

6. The package structure according to claim 1, further comprising a second bonding material disposed between the first carrier plate and the second carrier plate, and the first carrier plate and the second carrier plate are combined together via the bonding material.

7. The package structure according to claim 6, wherein a thickness of the second bonding material is larger than 20 micrometers.

8. The package structure according to claim 1, wherein the opening is larger than the power component.

* * * * *